United States Patent

Chuang

[11] Patent Number: 6,054,362
[45] Date of Patent: Apr. 25, 2000

[54] METHOD OF PATTERNING DUMMY LAYER

[75] Inventor: Andy Chuang, Hsinchu, Taiwan

[73] Assignee: United Microelectronics Corp., Hsinchu, Taiwan

[21] Appl. No.: 09/138,756

[22] Filed: Aug. 24, 1998

[30] Foreign Application Priority Data

May 26, 1998 [TW] Taiwan ................................. 87108194

[51] Int. Cl.$^7$ .................................................. H01L 21/76
[52] U.S. Cl. .......................... 438/405; 438/692; 438/959; 257/758; 257/506
[58] Field of Search .................................. 438/405, 425, 438/692, 959, 427; 257/758, 506

[56] References Cited

U.S. PATENT DOCUMENTS

| 5,728,620 | 3/1998 | Park | 438/425 |
| 5,734,192 | 3/1998 | Sengle et al. | 257/506 |
| 5,965,941 | 10/1996 | Weling et al. | 257/758 |

FOREIGN PATENT DOCUMENTS

| 11121410 | 2/1997 | Japan | H01L 21/304 |

*Primary Examiner*—Charles Bowers
*Assistant Examiner*—David S Blum
*Attorney, Agent, or Firm*—Christie, Parker & Hale, LLP

[57] ABSTRACT

A method of patterning a dummy layer is provided using the dark/clear ratio. First, the area of devices and the area of relevant devices are defined. The relevant devices are usually positioned around the devices. The devices, the relevant devices, and other regions are united according to the design rules to form a non-dummy pattern region. Then a dummy pattern region is defined. There are many dummy bulks in the dummy pattern region. Next, a known dark/clear ratio of the non-dummy pattern region is provided. A density of the dummy patterns is obtained from the known dark/clear ratio, the length of the dummy bulk, the width of the dummy bulk and a equation. The equation is as follows: the known dark/clear ratio=(the length−the parameter)(the width−the parameter)/[the length×the width−(the length−the parameter)(the width−the parameter)]. After obtaining the parameter, each dummy bulk is divided into two regions including a clear region and a dark region. A dummy layer is formed in the dark region of the dummy bulk.

24 Claims, 2 Drawing Sheets

METHOD OF PATTERNING DUMMY LAYER

CROSS-REFERENCE TO RELATED APPLICATION

This application claims the priority benefit of Taiwan application serial no. 87108194, filed May 26, 1998, the full disclosure of which is incorporated herein by reference.

BACKGROUND OF THE INVENTION

1. Field of the Invention

The invention relates in general to a method of patterning a dummy layer, and more particularly to a method of patterning a dummy layer by considering a dark/clear ratio.

2. Description of the Related Art

In the semiconductor IC process, after forming a shallow trench isolation (STI), there are active regions and inactive regions (dummy pattern regions) defined by the shallow trench isolation on a substrate. There are lots of devices including MOS devices or memory cells formed in the active region on the substrate. Metal interconnects are then formed on these devices for connecting the active regions. The metal interconnects usually elongate over the active regions. In the inactive regions there are no devices. The dummy pattern layer is formed in the inactive regions and is used to increase the performance of chemical mechanical polishing (CMP) on active regions and inactive regions. That is, the function of the dummy layer is to make the polishing rate on active regions the same as the polishing rate on inactive regions. Usually, the conventional dummy pattern layer contains random distributed patterns.

Conventionally, the method of forming a dummy pattern layer is very rough. First, an area of devices and an area of relevant devices are defined. The area of devices and the area of relevant devices are sized (a computer command) by magnifying them to form sizing regions. Next, the sizing regions are united to form a non-dummy pattern region. A dummy pattern region is defined as all regions on the substrate excluding the non-dummy pattern region. Then a dummy layer is formed in the dummy pattern region.

In the integrated circuits (IC) process, the conventional method of patterning a dummy layer includes lots of drawbacks. For example, when patterning the dummy layer, the conventional method of patterning a dummy layer doesn't take the dark/clear ratio into consideration. If the dark/clear ratio of the sizing regions is very different from the dark/clear ratio of the dummy layers, the polishing rate on the sizing regions is also very different from the polishing rate on the dummy pattern region. Therefore, there are residues such as silicon nitride formed in the dummy pattern region which cause a loading effect. The loading effect decreases the performance of chemical mechanical polishing.

SUMMARY OF THE INVENTION

It is an object of the invention to provide a method of patterning a dummy layer that takes the dark/clear ratio into consideration.

It is another object of the invention to provide a method of patterning a dummy layer that eliminates the loading effect over a substrate and increases the performance of chemical mechanical polishing.

A method of patterning a dummy layer comprises the following steps. First, the area of devices and the area of relevant devices are defined. The relevant devices are usually positioned around the devices. The devices, the relevant devices, and other regions are united according to the design rules to form a non-dummy pattern region. Then a dummy pattern region is defined as all regions on the substrate excluding the non-dummy pattern region. There are many dummy bulks in the dummy pattern region. Next, a known dark/clear ratio of the non-dummy pattern region is provided. Density of the dummy patterns is determined by the known dark/clear ratio, the length of the dummy bulk, the width of the dummy bulk and an equation. The equation is as follows: the known dark/clear ratio=(the length–the parameter)(the width–the parameter)/[the length×the width–(the length–the parameter)(the width–the parameter)]. After determining the parameters, each dummy bulk can be divided into two regions including a clear region and a dark region. A dummy layer is formed in the dark region of the dummy bulk.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The feature of the invention's method of patterning a dummy layer includes taking the dark/clear ratio into consideration. The dark/clear ratio of the dummy layer is calculated according an equation of the invention: the known dark/clear ratio=(the length–the parameter)(the width–the parameter)/[the length×the width–(the length–the parameter)(the width–the parameter)]. First, an area of devices and an area of relevant devices are defined. The relevant devices are usually positioned around the devices. The relation between the devices and relevant devices depends upon different conditions, such as:

(1) If the devices are active regions, the relevant devices include wells, poly-silicon gates, or contacts (2) If the device is a lower metal layer, the relevant device includes a contact or a metal via.

(3) If the device is an upper metal layer, the relevant device includes a metal via.

The devices, the relevant devices, and other regions are united according to the design rules to form a non-dummy pattern region. Then a dummy pattern region is defined as all regions on the substrate excluding the non-dummy pattern region. A dummy layer is formed in the dummy pattern region. The dummy layer includes many dummy bulks. The size of each dummy bulk is about the same. A known dark/clear ratio of the non-dummy pattern region is provided. Density of the dummy patterns is calculated by using the known dark/clear ratio of the non-dummy pattern region. After determining the density of the dummy patterns, each dummy bulk is divided into two regions including a clear region and a dark region. A dummy layer is formed in the dark region of the dummy bulk.

Figure 1:
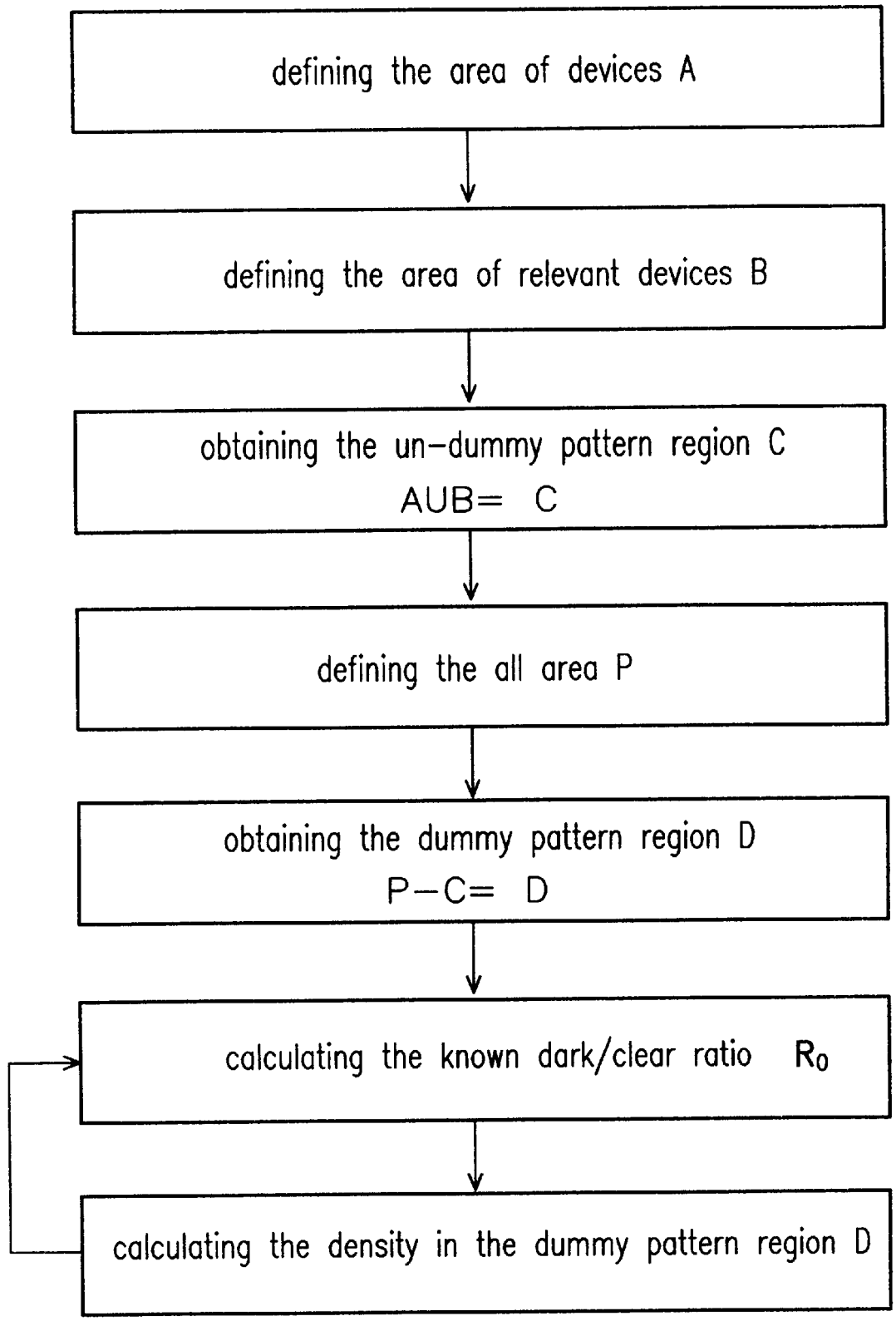
FIG. 1 shows a flow chart of the patterning process for a dummy layer of the invention.
Figure 2A:
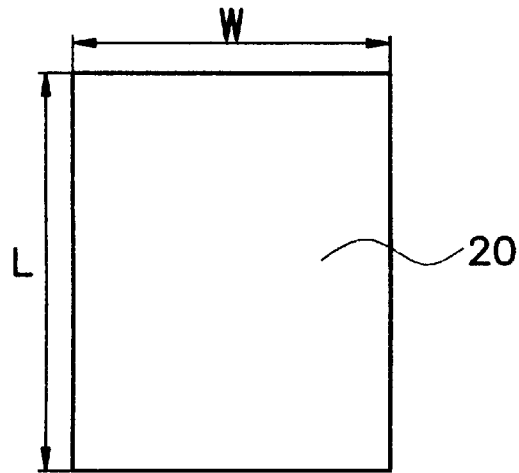
FIGS. 2A and 2B are top views showing a method of patterning a dummy layer of the invention.
Figure 2B:
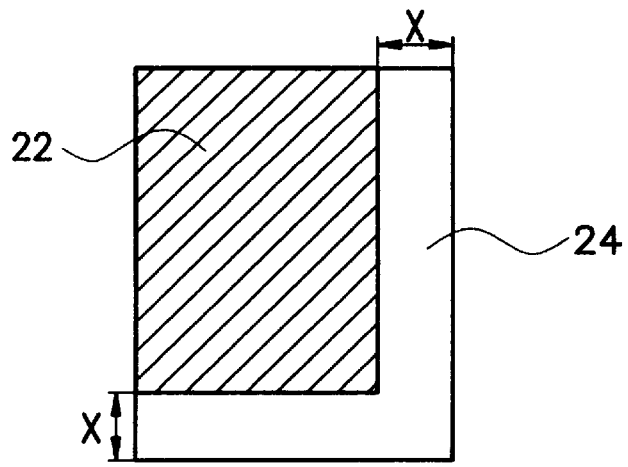

FIG. 1 shows a flow chart of the process for patterning a dummy layer of the invention. FIGS. 2A and 2B are top views showing a method of patterning a dummy layer of the invention. First, referring to FIG. 1, an area A of devices is defined. An area B of relevant devices is defined. The relevant devices can be positioned around the devices. The relation between the area A of devices and the area B of relevant devices depends upon following conditions:

(1) If the area A of devices includes active regions, the area B of relevant devices includes wells, poly-silicon gates, or contacts.

(2) If the area A of devices includes a lower metal layer, the area B of relevant devices includes a contact or a metal via.

(3) If the area A of devices includes an upper metal layer, the area B of relevant devices includes a metal via.

Referring to FIG. 1, a sizing step is or is not performed. The devices and relevant devices are sized to magnify them. For example, the sizing step includes defining the spacing "a" between devices according the design rules and sizing the area A by adding "a" each side. Or the sizing step includes defining the spacing "b" between a device and a relevant device according the design rules and sizing the area B by adding "b" each side.

Next, referring to FIG. 1, a uniting step is formed. A non-dummy pattern region C is determined by uniting the area A and the area B. That is, A∪B=C. Alternately, the area A, the area B, the sized area A and the sized area B are united according to the design rules (A∪B∪ sized A∪ sized B) to form a non-dummy pattern region C.

Referring to FIG. 1, all area P on a substrate is obtained. Then a dummy pattern region D is defined as all area P excluding the non-dummy pattern region C. That is, P−C=D. In the dummy pattern region D there are many divided dummy bulks 20, as shown in FIG. 2A. The size of each dummy bulk is about the same. The length of the dummy bulks 20 is L and the width of the dummy bulks 20 is W.

Next, referring next to FIG. 1, a known dark/clear ratio $R_0$ of the non-dummy pattern region C is provided. The known dark/clear ratio $R_0$ is the ratio of the dark area (device area) to the clear area (non-device area) in the non-dummy pattern region C.

Referring to FIG. 2A, a calculating step of the invention is performed to obtain the density of the dummy pattern region D by using the known dark/clear ratio $R_0$. Each dummy bulk 20 is divided into two regions including a dark region 22 and a clear region 24, as shown in FIG. 2B. A dummy layer is formed in the dark region 24 of the dummy bulk 20.

The calculating step of the invention includes obtaining the length L of the dummy bulks 20 and the width W of the dummy bulks 20. A parameter X is defined and calculated by following equation of the invention:

The known dark/clear ratio $R_0 = (L-X)(W-X)/[L \times W - (L-X)(W-X)]$

The parameter X is obtain according the equation of the invention. Then each dummy bulk 20 is divided the dark region 22 and the clear region 24, as shown in FIG. 2B. The dummy layer of the invention is formed in the dark region 24 of the dummy bulk 20.

Figure 3:
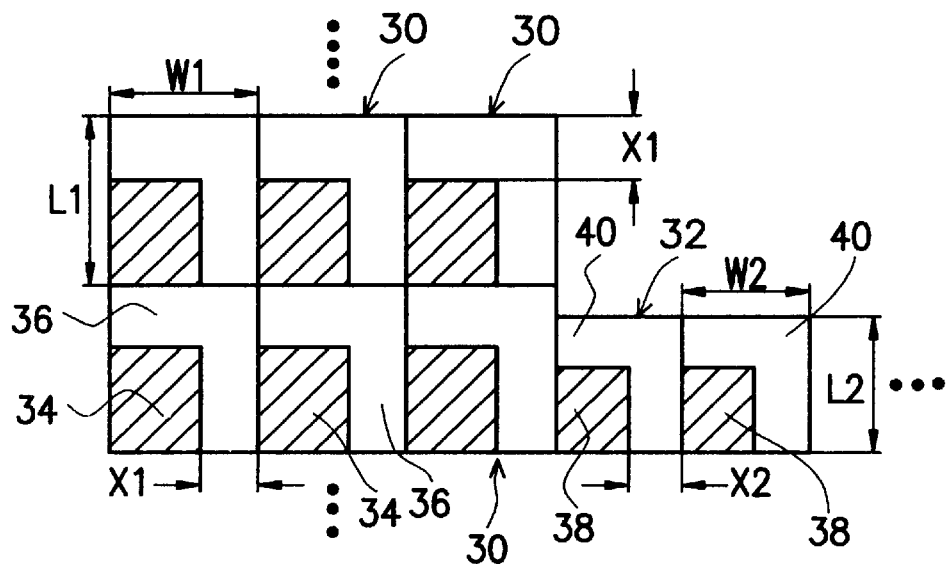
FIG. 3 is a top view showing an another method of patterning a dummy layer of the invention.

If necessary, the above steps can be repeated. FIG. 3 is a top view showing an another method of patterning a dummy layer of the invention. There are many dummy bulks 30 or 32 formed with different sizes in the dummy pattern region D. The density in the dummy pattern region D is obtained in two steps by using the known dark/clear ratio $R_0$. First, the dark region 34 and the clear region 36 of the dummy bulk 30 are decided. Then the dark region 38 and the clear region 40 of the dummy bulk 32 are decided. Detailed description follows.

First, the method of defining the dummy pattern region D is the same as in the above description. In this embodiment, there are different dummy bulks, for example a dummy bulk 30 or a dummy bulk 32 of different sizes in the dummy pattern region D. The length of the dummy bulks 30 is L1 and the width of the dummy bulks 30 is W1. A parameter X1 is defined and calculated by following equation of the invention:

The known dark/clear ratio $R_0 = (L1-X1)(W1-X1)/[L1 \times W1 - (L1-X1)(W1-X1)]$ The parameter X1 is obtained according the equation of the invention. Then each dummy bulk 30 is divided the dark region 34 and the clear region 36, as shown in FIG. 3. The dummy layer of the invention is formed in the dark region 34 of the dummy bulk 30.

Next, the length of the dummy bulks 32 is L2 and the width of the dummy bulks 32 is W2. A parameter X2 is defined and calculated by following equation of the invention:

The known dark/clear ratio $R_0 = (L2-X2)(W2-X2)/[L2 \times W2 - (L2-X2)(W2-X2)]$ The parameter X2 is obtained according the equation of the invention. Then each dummy bulk 32 is divided into the dark region 38 and the clear region 40, as shown in FIG. 3. The dummy layer of the invention is formed in the dark region 38 of the dummy bulk 32. Therefore the dummy layer of the invention is formed both in the dark region 34 of the dummy bulk 30 and in the dark region 38 of the dummy bulk 32.

The method of patterning a dummy layer of the invention has the following features:

1. The method of patterning a dummy layer of the invention is performed by using the dark/clear ratio of the non-dummy pattern region C to decide the density in the dummy pattern region D. The dark/clear ratio of the non-dummy pattern region C is about the same as the dark/clear ratio of the dummy pattern region D. Therefore, the polishing rate on the non-dummy pattern region C is about the same as the polishing rate on the dummy pattern region D which increases the performance of chemical mechanical polishing.

2. The method of patterning a dummy layer of the invention eliminates the loading effect over a substrate.

While the invention has been described by way of example and in terms of preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications, similar arrangements and procedures.

What is claimed is:

1. A method of patterning a dummy layer, the method comprising the steps of:

providing a semiconductor substrate and defining all areas on the semiconductor substrate;

defining an area of devices and an area of relevant devices, wherein the relevant devices are positioned around the devices;

defining a non-dummy pattern region by uniting the area of devices and the area of relevant devices;

defining a dummy pattern region as all areas excluding the non-dummy pattern region, wherein there are many divided dummy bulks in the dummy pattern region;

providing a known dark/clear ratio of the non-dummy pattern region; and obtaining a density in the dummy pattern region by using the known dark/clear ratio.

2. A method as claimed in claim 1, which further comprises a step of sizing the devices and the relevant devices to magnify the devices and the relevant devices.

3. A method as claimed in claim 2, wherein the sizing step includes defining a first spacing between the devices according the design rule, and sizing the area of devices by adding the first spacing on each side.

4. A method as claimed in claim 2, wherein the sizing step includes defining a second spacing between the device and the relevant device according the design rule, and sizing the area of relevant devices by adding the second spacing on each side.

5. A method as claimed in claim 1, wherein the devices include active regions.

6. A method as claimed in claim 5, wherein the relevant devices include wells, poly-silicon gates, and contacts.

7. A method as claimed in claim 1, wherein the devices include a lower metal layer.

8. A method as claimed in claim 7, wherein the relevant devices include a contact or a metal via.

9. A method as claimed in claim 1, wherein the devices include an upper metal layer.

10. A method as claimed in claim 9, wherein the relevant devices include a metal via.

11. A method as claimed in claim 1, wherein the known dark/clear ratio of the non-dummy pattern region is the ratio of a dark area (device area) to a clear area (non-device area) in the non-dummy pattern region.

12. A method as claimed in claim 1, wherein the step of obtaining the density in the dummy pattern region comprises:

defining a length of the dummy bulk and a width of the dummy bulk;

defining a parameter;

providing an equation: the known dark/clear ratio=(the length−the parameter)(the width−the parameter)/[the length×the width−(the length−the parameter)(the width−the parameter)]; and obtaining the parameter from the equation to divide each dummy bulk into a dark region and a clear region, wherein a dummy layer is formed in the dark region of the dummy bulk.

13. A method of fabricating a trench isolation, the method comprising the steps of:

providing a semiconductor substrate and defining all areas on the semiconductor substrate;

defining an area of devices and an area of relevant devices, wherein the relevant devices are positioned around the devices;

defining a non-dummy pattern region by uniting the area of devices and the area of relevant devices;

defining a dummy pattern region as the all areas excluding the non-dummy pattern region, wherein there are first dummy bulks and second dummy bulks in the dummy pattern region;

providing a known dark/clear ratio of the non-dummy pattern region; and obtaining a density in the dummy pattern region by using the known dark/clear ratio, wherein the step of obtaining the density in the dummy pattern region comprises:

defining a first length of the first dummy bulk and a first width of the first dummy bulk;

defining a first parameter;

providing an equation: the known dark/clear ratio=(the first length−the first parameter)(the first width−the first parameter)/[the first length×the first width−(the first length−the first parameter)(the first width−the first parameter)]; and obtaining the first parameter from the equation to divide each first dummy bulk into a first dark region and a first clear region, wherein a dummy layer is formed in the first dark region of the first dummy bulk.

14. A method as claimed in claim 13, which further comprises the step of sizing the devices and the relevant devices to magnify the devices and the relevant devices.

15. A method as claimed in claim 14, wherein the sizing step includes defining a first spacing between the devices according the design rule, and sizing the area of devices by adding the first spacing on each side.

16. A method as claimed in claim 14, wherein the sizing step includes defining a second spacing between the device and the relevant device according the design rule, and sizing the area of relevant devices by adding the second spacing on each side.

17. A method as claimed in claim 13, wherein the devices include active regions.

18. A method as claimed in claim 17, wherein the relevant devices include wells, poly-silicon gates, and contacts.

19. A method as claimed in claim 13, wherein the devices include a lower metal layer.

20. A method as claimed in claim 19, wherein the relevant devices include a contact or a metal via.

21. A method as claimed in claim 13, wherein the devices include an upper metal layer.

22. A method as claimed in claim 21, wherein the relevant devices include a metal via.

23. A method as claimed in claim 13, wherein the known dark/clear ratio of the non-dummy pattern region is the ratio of a dark area (device area) to a clear area (non-device area) in the non-dummy pattern region.

24. A method as claimed in claim 13, wherein the step of obtaining the density in the dummy pattern region furthermore comprises:

defining a second length of the second dummy bulk and a second width of the second dummy bulk;

defining a second parameter;

providing an equation: the known dark/clear ratio=(the second length−the second parameter)(the second width−the second parameter)/[the second length×the second width−(the second length−the second parameter)(the second width−the second parameter)]; and obtaining the second parameter from the equation to divide each second dummy bulk into a second dark region and a second clear region, wherein the dummy layer is formed both in the first dark region of the first dummy bulk and in the second dark region of the second dummy bulk.

* * * * *